219-121 SR
MTR04 XR 3,140,379
REFERENCE SEARCH ROOM
TX 219/121 EM

INVENTORS
FRITZ SCHLEICH
KARL HEINZ STEIGERWALD
BY Emory Whittemore Sandoe & Graham
Attorneys

3140379
OR IN 219/69R

INVENTORS
FRITZ SCHLEICH
BY KARL HEINZ STEIGERWALD
Emery Whittemore Landon Sahn
Attorney INVENTORS
FRITZ SCHLEICH
BY KARL HEINZ STEIGERWALD
Emery Whittemore Sandoe & Graham
Attorneys INVENTORS
FRITZ SCHLEICH
BY KARL HEINZ STEIGERWALD
Emery, Whittemore, Sandoe & Graham
Attorneys United States Patent Office 3,140,379
Patented July 7, 1964

3,140,379
METHOD FOR FORMING MODULAR ELECTRONIC COMPONENTS

Fritz Schleich, Unterkochen, Wurttemberg, and Karl Heinz Steigerwald, Heidenheim (Brenz), Germany, assignors, by mesne assignments, to United Aircraft Corporation, East Hartford, Conn., a corporation of Delaware Filed Jan. 24, 1961, Ser. No. 84,663
Claims priority, application Germany Mar. 30, 1960
1 Claim. (Cl. 219—69)

This invention relates to modular electrical components and, more particularly, relates to an improved method and apparatus for fabricating such modular components.

Modular electrical components, such as module wafers, consist of a supporting plate and layers of material bonded directly thereto. For example, a common form of electrical component wafer is a ceramic wafer to which is fused a conductive layer. The physical shape of the conductive layer will determine the electrical characteristics of the component. By variation of the physical shape of the conductive layer, and by use of the proper combination of materials, inductances, transistors, diodes, storage cores, etc. may be produced.

For various practical reasons, production of the components usually entails a subtractive process. That is, the face of the supporting plate will be entirely coated with a layer of the desired material and various parts of this layer physically removed therefrom to form the desired electrical component.

The removal of the layers applied to the carrier have taken several forms, the most successful being mechanical removal and chemical removal.

For example, the layers may be mechanically removed from the supporting plate by mechanical scoring or abrasion. Such removal has been performed, for example, by mechanical abrasion with diamond studded bits. However, this production method often damages the supporting plate and results in incomplete removal of the conducting layer. The incomplete removal of the layer material leaves undesirable conducting bridges which adversely effect the electrical properties of the component and preclude reliability in manufacture because of the variation from component to component produced by the same process. In addition, machining of each construction element is quite slow and cannot be controlled to the accuracies required. The difficulty of machining is particularly apparent during the production of elements requiring removal of material along curved lines (e.g. during manufacture of inductance elements) since the mechanical control suitable for producing such curved lines is very complicated and difficult to control.

Such modular electrical components have also been produced by a photo-chemical process. In such a method, the layering material is selectively protected by a resist and the exposed areas etched away. However, such method is very expensive particularly with small components. Additionally, this type of production does not offer either the accuracies required nor the flexibility during construction found necessary by the art.

Further, the limitations of manufacture have limited the structural shape of the component, usually to a planar wafer.

In many applications, it would be advantageous to employ modules of different form.

It is, therefore, the primary object of this invention to provide an improved method for the fabrication of modular electrical components.

It is a further object of this invention to provide improved apparatus for the fabrication of modular electrical components.

It is a still further object of this invention to provide improved modular electrical components.

In accordance with these objects, there is provided, in a preferred embodiment of this invention, a charge carrier beam apparatus for generation of a beam of charged particles and focussing of such particles upon a target. Means are provided to deflect the charge carrier beam along predetermined coordinates. Means are provided to control the intensity of the charge carrier beam.

In accordance with the method of this invention, layers of requisite material are applied upon a supporting plate structure in accordance with the desired characteristic of the finished modular components. The layers are selectively removed along predetermined locations to form the modular component from the material remaining on the supporting plate by a controllably deflected impinging beam of charged particles.

The deflection of the electron beam for the machining process is preferably programmed, which program may be controlled by templates or by tape storage control devices. The machining of the modular component may be done in steps, and the value of the component measured at each step. When the component value reaches the predetermined value, the machining may be automatically stopped.

The modular elements produced thereby may be produced at very high speeds and may be reproduced with the requisite accuracies and dependability in production. Further, modular components of novel configuration may be produced. For example, a resistor may be formed in a cylindrical tube having a conductive layer applied to the inside surface thereof. The conductive layer may be selectively removed in a predetermined pattern to provide the required resistance value between terminals. A resistor constructed in this manner may be handled without danger of damage to the supported layer and would have a high electrical capacity due to the cooling air rising therethrough at relatively high flow rates caused by the chimney action of such configuration.

As mentioned above, it is possible to machine the modular components very rapidly. For example, a nickel chromium layer of three to five microns thick evaporated on a ceramic plate can be machined at a speed of about one meter per second. The milling may be controlled thereby so precisely that the width of the line removed from the layer amounts to only a few microns.

The machining of the modular components subjects the component to relatively high thermal stresses. In those applications where the base material cannot withstand continuous machining and the resultant thermal stress, the thermal stress on the material can be dissipated by pulsing the impinging charge carrier beam and deflecting the beam between impulses. In this manner, the thermal stresses are distributed and can be held below the safe level determined by the material characteristics.

Deflection of the beam may be controlled by a program stored on magnetic tape which program will sequentially select beam deflection currents and control the beam intensity and/or beam impulse rate.

Alternately, the deflection of the beam may be controlled from a template scanned by a television camera or a flying spot scanner, the raster of which is scanned coincidently with the deflection of the beam. The template will then control beam impulses for the machining operation.

This invention will be more clearly understood by reference to the following description taken in conjunction with the accompanying drawings, of which:

Figure 1:
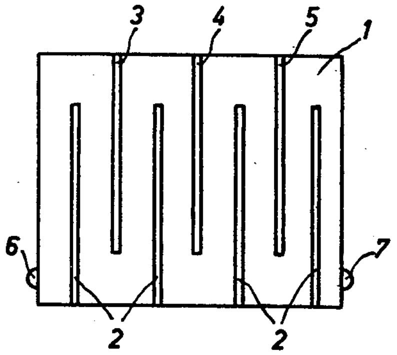
FIG. 1 is a plan view of a resistive electrical component produced by the method of this invention.

In FIG. 1 there is shown a resistive modular element 1 comprising a carrier plate, such as a ceramic wafer, on which is evaporated a thin (3–5 microns thick) conductive layer (e.g. a nickel-chromium layer). The layer is selectively evaporated by the impinging beam of charged particles along lines 2–5. The path length between electrodes 6 and 7 is thereby controllably lengthened to provide the desired electrical resistance.

The lines 2–5 can be milled away by means of a charge carrier beam to a width of only a few microns and, due to the high energy densities obtainable with focused beams of charged particles, the milling can be done precisely, leaving no unremoved material bridging the milled lines.

A very large number of thin lines can be accommodated within the modular element since the charge carrier beam can be controlled with great accuracy. Furthermore, the production of the modular components consumes but little time. The electronic modular element represented in FIG. 1, for instance, if made with an edge length of 8 mm., can be produced within a time of 0.1 second.

If it is intended to produce a resistive modular element with high ohmic resistance, then this can be effected by milling a very large number of thin lines within the modular element. It is, however, also possible to evaporate a thin layer consisting of a metal, preferably chromium or platinum, and carbon on a plane supporting plate which is, for example, made of quartz glass, and to mill only a few lines. In this case there is produced a resistive modular element of high ohmic resistance, because said layer has only a low conductivity. The layer itself is produced by evaporating simultaneously said metal and said carbon. The layer produced thereby is very fine-grained and has a low conductivity.

Figure 2:
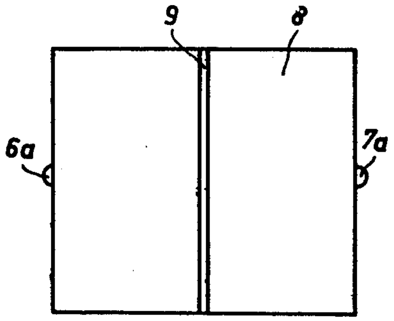
FIG. 2 is a plan view of a capacitor component produced by the method of this invention.

In FIG. 2 there is shown an electronic modular element 8 of the same construction as the element of FIG. 1. However, only one continuous line 9 is milled away. Thus, the element may be used as a capacitor. The terminals are designated by **6*a* and 7*a***.

The width of the line 9 and thereby the capacity of the capacitor can be varied within wide limits. The line width variation can be effected by a variation of the beam spot size, controlled by beam focusing, or by deflecting a beam of fixed size in several displaced, overlapping passes over line 9.

Figure 3:
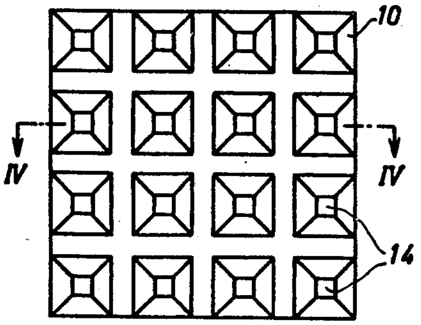
FIG. 3 is a plan view of a rectifier stack produced by the method of this invention.
Figure 4:
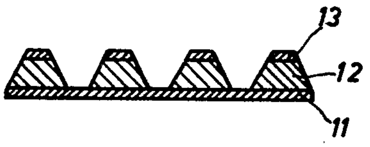
FIG. 4 is a section taken along lines 4—4 of FIG. 3.

In FIGS. 3 and 4 there is shown a modular element 10 which consists of a carrier or base plate 11 of conducting material, a layer 12 of semi-conducting material applied thereto, and a layer 13 of conducting material applied to the said layer 12. The charge carrier beam is controlled so that the layers 12 and 13 are removed by evaporation along a checker-board pattern. For the purpose of producing the special shape of the individual elements, the focusing of the charge carrier beam and, thus, the beam spot size is varied during the passes over the layer to produce the pyramid form of the elements. The electronic component represented in FIGS. 3 and 4 comprises a multiplicity of rectifiers 14. Such a rectifier plate is particularly useful in computor applications.

Figure 5:
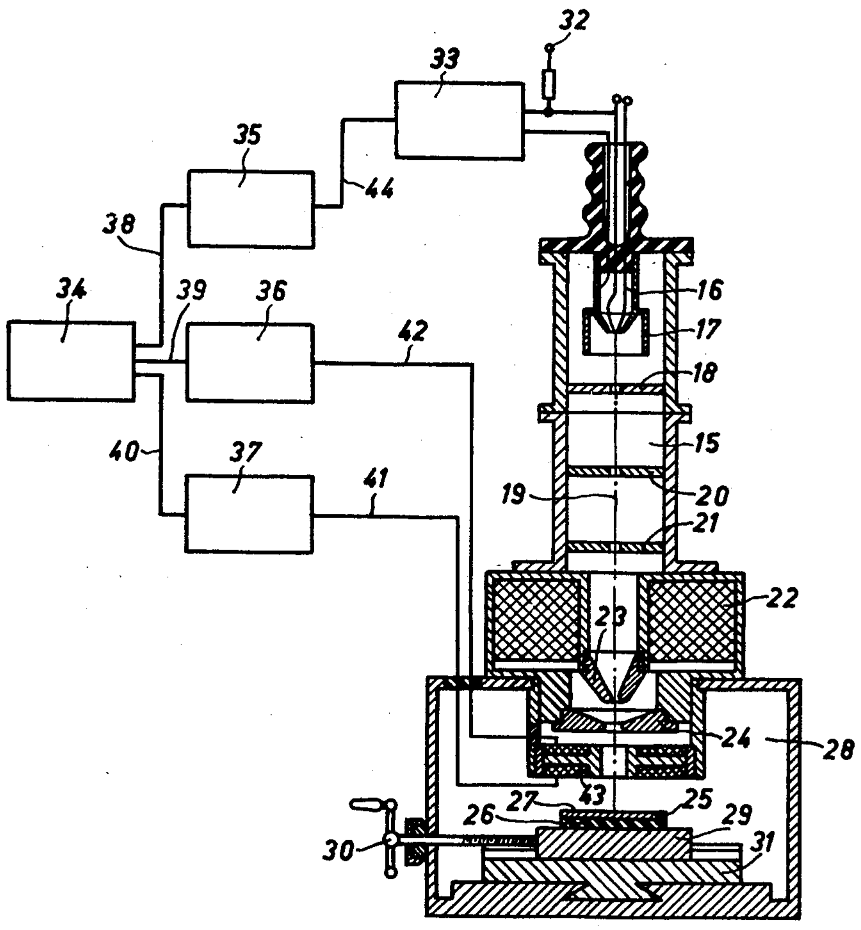
FIG. 5 is a cross-section view of apparatus constructed in accordance with this invention in which circuit elements are represented in block diagram form.

In FIG. 5 there is shown equipment for the production of modular electrical components according to the methods of this invention. By 15 there is designated a vacuum vessel within which there is arranged a beam generating system consisting of the cathode 16, the control electrode 17 and the anode 18. For the further shaping of the electron beam 19 there are provided two diaphragms 20 and 21. An electro-magnetic lens 22, the pole pieces of which are designated by 23 and 24, is provided to focus the electron beam upon the element 25 to be machined. The said modular element is here represented at great magnification and consists of a ceramic plate 26 and of a thin layer 27 of conducting material applied thereto.

The element 25 is arranged within a chamber 28 upon a stage 29 which is capable of being displaced by means of a spindle 30 upon a further stage 31. The said stage 31 in turn can be displaced at right angles to the plane of the drawing by means of a further spindle (designated by 45 in FIG. 6 and not shown here).

The cathode 16 is supplied with a negative high voltage of, for example, —100 kv. from source 32. The control electrode 17 has negative bias relative to the cathode and, for example, has a potential of —101 kv. Thereby the beam generating system is locked. If now a positive impulse is supplied to the control electrode 17, then for the period of the duration of the said trigger impulse an electron beam impulse 19 is produced which impinges upon the construction element 25. For supplying the trigger impulse to the control electrode an impulse transformer 33 is provided. It serves for the transmission of the trigger impulses arriving on the low-voltage side to the control electrode 17 connected to the high voltage biasing source.

For control of the machining of the modular element, there is provided a programmer to sequentially select the necessary deflection of the beam, and to control the beam impingement at each deflected position.

For this purpose there is provided a storage element 34 which may conveniently consist of a magnetic tape provided with a plurality of tracks and the associated readout heads.

The signals supplied by the storage element are applied to decoder networks 35, 36 and 37 over leads 38, 39 and 40 respectively. The decoders contain conventional electronic switches responsive to the "Yes-No" commands of the storage element output and related elements to supply an output waveform responsive to switch setting. Decoder 35 controls the amplitude and duration of the beam triggering pulse. Decoders 36 and 37 control the current amplitude of the deflection currents supplied to the deflection system 43, thereby to control the beam deflection along *x–y* coordinate axes.

The deflection system is of conventional construction having four coils wound on cores of high permeability material and positioned to create deflecting fields in the coordinate axes. The coils are preferably cast in synthetic resin.

In operaton, the decoders 36 and 37 respectively will apply the selected deflection currents, $i_y$ and $i_x$, to the coils of the deflection system 43. Decoder 35 will determine the pulse amplitude and width, and, upon a command pulse given after the deflection currents are established, will apply the selected pulse to the transformer 33. The pulse, after passing through transformer 33, will overcome the blocking bias in the beam generating equipment, triggering the release of the beam which impinges upon the modular element 25 at the location determined by the deflection system 43 for the duration of the pulse. An impulse frequency of about 2.5 kc./s. can be achieved without difficulty with impulse durations of $10^{-6}$ to $10^{-8}$ seconds.

By means of the equipment represented in FIG. 5, it is possible with suitable programming to produce the modular components shown in FIGS. 1 to 4. In many applications, it is desirable to use templates or master drawings for the production of the modular components.

Figure 6:
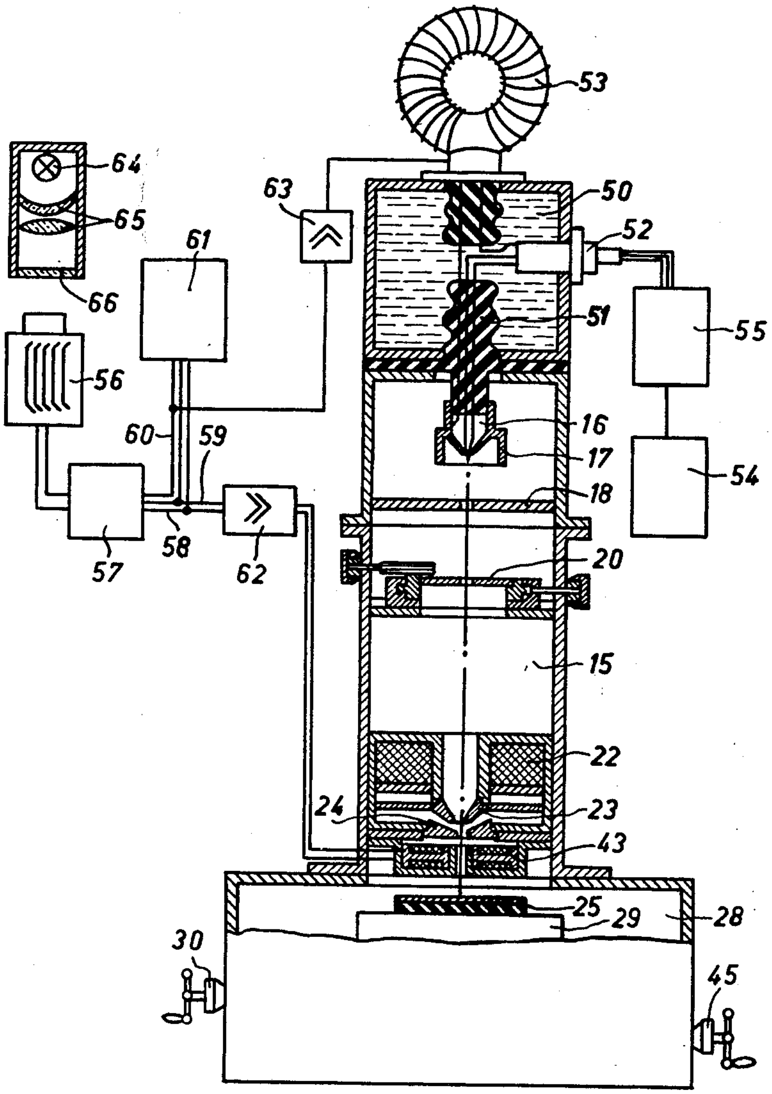
FIG. 6 is a cross-section view of another embodiment of apparatus in accordance with the present invention.

In such applications, the embodiment shown in FIG. 6 may advantageously be employed.

In FIG. 6 there is shown beam generating apparatus comprising an evacuated housing 15 to which is coupled an oil-filled container 50. Insulating extension 51 of the insulator carrying the beam generating system, the three-wire high-voltage cable 52, and the insulating extension of the high-voltage insulating transformer 53 extend into the container 50. The transformer 53 serves to couple the control impulses produced on the low-voltage side to the beam generating system connected to the high-voltage potential.

The high voltage is produced in the device 54 and is supplied to the device 55 by means of a high-voltage cable fitted with a grounded sheath. The said device serves to produce the variable cathode heater voltage and the adjustable control electrode bias voltage. The voltages here produced are introduced into the oil-filled container 50 via the high-voltage cable 52. The heater voltage is therein supplied directly to the cathode 16. The control electrode voltage is fed to the secondary winding of the high-voltage transformer 53 through the insulating extension and from there it reaches the control electrode 17 directly. The control electrode voltage is so adjusted that in the position of rest the beam generating system is blocked.

For control of beam deflection and operation, there is provided a television camera 56 of usual design which is supplied with the necessary working voltages from the control center 57. The video signal put out by the camera 56 is fed to the control center 57 where it is amplified. The control center 57 supplies the deflecting currents required to produce the horizontal scanning deflection via the lead 58 while the deflecting currents required for vertical deflection are supplied via the lead 59. The amplified video signal is applied to a viewing device 61, which is also supplied with the required deflecting currents over lead 60. The viewing device 61 therefore delivers the image scanned by the television camera 56.

The deflecting currents are fed to an amplifier 62 and from there reach the deflecting coils of the deflecting element 43. The video signals are fed to an amplifier 63 and from there reach the primary winding of the insulating transformer 53.

From the above described design of the equipment, it is immediately evident that by means of the said equipment the image of a template 66 is directly transferred to the modular element 25 as soon as the said template is illuminated by means of a lamp 64 and of an optical system 65 and the television equipment is put into operation. The image 66 to be transferred may for instance look just as it is represented in the FIGS. 1 and 2. Therein it is merely necessary to make transparent the lines 2–5 and to construct the remainder of the template so as to be opaque.

Figures 7, 8:
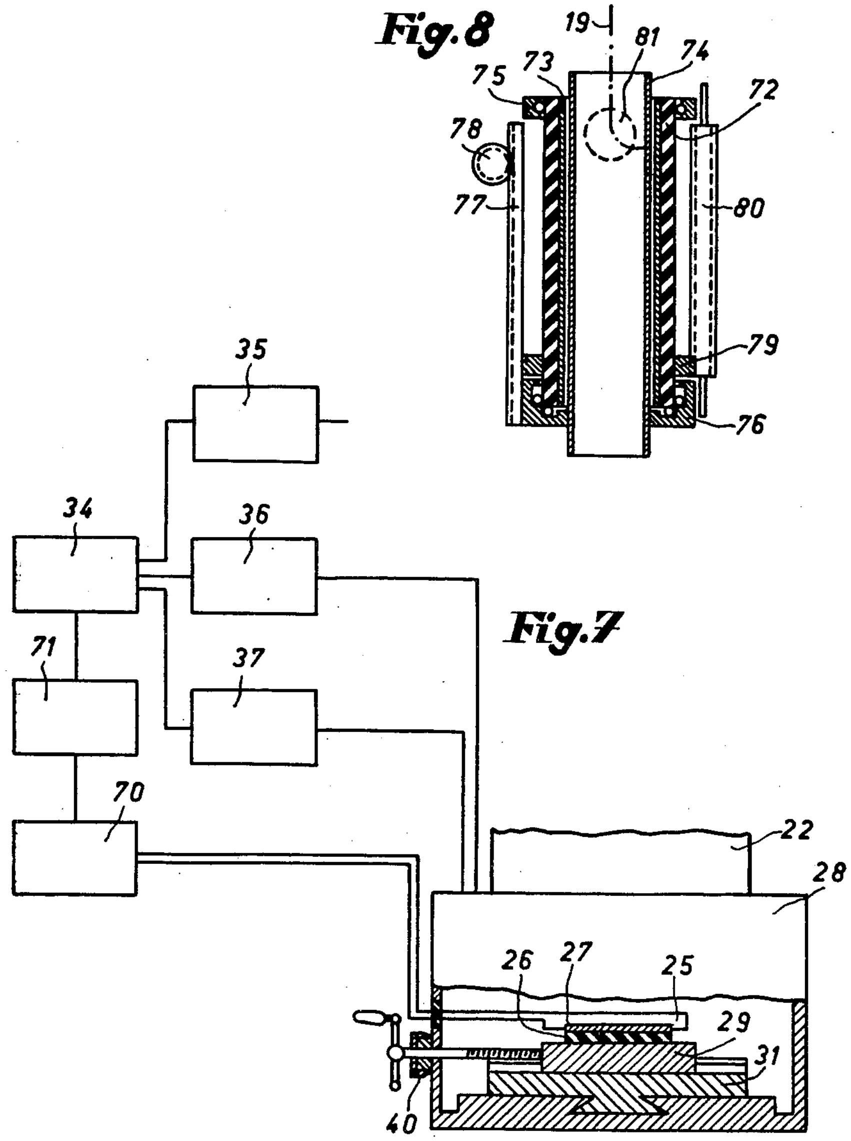
FIG. 7 is a partially sectioned view of a portion of equipment in accordance with a still further embodiment of this invention.
FIG. 8 is a sectioned view of a tubular electrical component in a mounting suitable for machining.

FIG. 7 shows a further embodiment of the equipment represented in FIG. 5. Here there is provided an equipment 70 which during the operating cycle measures intermittently the inductance of the modular element 25. As soon as the predetermined inductance value is reached, an impulse is supplied to the programmer storage element 34 via control device 74 so that the programmer storage element is switched off.

By means of the equipment represented in FIG. 7, it is for instance possible to measure the resistance of the modular element represented in FIG. 1 during the operating cycle. For the said purpose, it is required to connect the equipment 70 to the electrodes 6 and 7. In the said case, programming is effected in that at first the lines 2 are completely milled away. Thereupon the lines 3, 4 and 5 are milled in such a way that subsequent electron beam impulses impinge in this order upon the lines 3, 4 and 5. This means that the lines 3–5 are milled simultaneously, wherein the milling proceeds from the top downwards in steps. When the predetermined resistance value has been approximately attained, the operating steps become smaller and smaller until upon reaching of the predetermined value the programmer storage element 34 is switched off via the control device 71 so that therefore the lines 3–5 have a length which is determined solely by the desired resistance value.

In the said way, it is also possible to produce for instance a capacitor of predetermined capacity. For example, in the modular element 8 represented in FIG. 2, the line 9 is swept over several times by the charge carrier beam. After every sweep the capacity is measured and the line 9 is broadened by every sweep by an amount dependent upon the value measured. The said broadening process is continued until the desired capacity has been attained.

If, in the equipment represented in FIG. 6, the inductance of the modular element 25 is to be measured during the operating cycle then the image template 66 to be scanned is so constructed that during certain periods when the charge carrier beam is switched off it delivers a signal putting into operation a measuring device not here represented.

FIG. 8 shows a modular element which consists of a tube of insulating material 72 and of a layer 73 of conducting material applied to the internal surface of the said tube. Within the tube **72*a* protective tube 74 fitted with a longitudinal slot or with a bore is arranged so as to be easily interchangeable. The said tube serves to intercept the material evaporated from the layer 73 and to screen from charges the areas of the tube 72 which are not covered by the layer 73**.

The tube 72 is supported in a ring 75 so as to be capable of rotation and longitudinal displacement and in a ring 76 so as to be capable of rotation. The ring 76 is fixedly attached to a rack 77 which meshes with a pinion 78 driven by an electric motor not here represented. By switching on the motor connected with the pinion, the tube of insulating material 72 is therefore displaced in its axial direction while the protective tube 74 remains stationary.

The tube 72 is furthermore attached to a ring-shaped gear 79 which meshes with a gear 80 extended in its axial direction. The gear 80 is also driven by means of an electric motor not here represented and therefore produces rotation of the tube 72.

The electron beam 19 incident along the axis of the tube is deflected by means of a magnetic field towards the layer 73 through the slot of the tube 74. The magnetic deflecting field is formed by two magnetic poles arranged outside the tube 72 of which the pole 81 only is seen here.

By suitable rotation of the gears 78 and 80, it is possible to attain the result that the tube 72 is axially displaced while steadily rotating. The electron beam 19 will consequently mill a spiral line from the layer 73. The modular element so produced can with advantage be used as a resistor. In the said case when the remaining part of the layer 73 is heated by the passage of a current, a chimney effect is produced and the resistor is automatically cooled by the rising warm air.

The modulator element represented in FIG. 8 can also be used as an inductance. Generally speaking the said modular element has the advantage that the conducting layer is protected from damage, as by handling, without any special protective measures so that no additional manufacturing costs or steps need be incurred for such protection.

It is evident that the equipments represented in FIGS. 5, 6 and 7 serving for the production of modular components according to the invention represent merely embodiments thereof, and that the said modular components can also be produced by means of different equipments provided only that the said equipments permit control of the beam deflection and variation of the operating values of the charge carrier beam according to a predetermined program. It is, for example, possible to use a flying spot scanner instead of the television equipment represented in FIG. 6.

This invention may be variously embodied and modified within the scope of the subjoined claim.

What is claimed is:

A method of manufacturing a thin film resistor from a substrate having at least a first layer of conductive material deposited on a surface thereof consisting of the steps of: generating a beam of electrons; adjusting the intensity of the beam to a predetermined value; focussing the beam on the conductive layer; causing relative movement between the beam and the substrate whereby the beam moves over the layer in accordance with a predetermined pattern, the layer being removed along lines of such pattern upon impingement of the beam thereon; periodically interrupting the beam during the relative motion; measuring the resistance of the component during intervals when the beam is interrupted; and shutting the beam off when the resistance of the component reaches the desired value.

References Cited in the file of this patent

UNITED STATES PATENTS

| | | |
|---|---|---|
| 2,856,544 | Ross | Oct. 14, 1958 |
| 2,868,947 | Williams | Jan. 13, 1959 |
| 2,886,692 | Oyler | May 12, 1959 |
| 2,989,614 | Steigerwald | June 20, 1961 |